US 6,700,143 B2

(12) United States Patent
Tuan et al.

(10) Patent No.: US 6,700,143 B2
(45) Date of Patent: Mar. 2, 2004

(54) DUMMY STRUCTURES THAT PROTECT CIRCUIT ELEMENTS DURING POLISHING

(75) Inventors: Hsing Ti Tuan, Cupertino, CA (US); Chung Wai Leung, Milpitas, CA (US)

(73) Assignee: Mosel Vitelic, Inc., Hsin-Chu (TW)

( * ) Notice: Subject to any disclaimer, the term of this patent is extended or adjusted under 35 U.S.C. 154(b) by 0 days.

(21) Appl. No.: 10/165,741

(22) Filed: Jun. 6, 2002

(65) Prior Publication Data

US 2002/0151141 A1 Oct. 17, 2002

Related U.S. Application Data

(60) Division of application No. 09/846,123, filed on Apr. 30, 2001, now Pat. No. 6,559,055, which is a continuation-in-part of application No. 09/640,139, filed on Aug. 15, 2000, now Pat. No. 6,355,524.

(51) Int. Cl.[7] .............................................. H01L 31/119
(52) U.S. Cl. ..................... 257/288; 287/296; 287/750; 287/758; 287/752
(58) Field of Search .................... 257/288, 296, 257/750, 758, 752

(56) References Cited

U.S. PATENT DOCUMENTS

| 4,794,565 | A | 12/1988 | Wu et al. .................... 365/185 |
| 5,029,130 | A | 7/1991 | Yeh ............................ 365/185 |
| 5,045,488 | A | 9/1991 | Yeh ............................ 437/43 |
| 5,067,108 | A | 11/1991 | Jenq ........................... 365/185 |
| 5,120,671 | A | 6/1992 | Tang et al. .................. 437/43 |
| 5,202,850 | A | 4/1993 | Jenq ........................... 365/185 |
| 5,212,541 | A | 5/1993 | Bergemont .................. 257/319 |
| 5,217,920 | A | 6/1993 | Mattox et al. ................ 437/67 |
| 5,242,848 | A | 9/1993 | Yeh ............................ 437/43 |
| 5,264,387 | A | 11/1993 | Beyer et al. .................. 437/62 |
| 5,265,059 | A | 11/1993 | Wells et al. ................. 365/204 |
| 5,278,087 | A | 1/1994 | Jenq ........................... 437/43 |
| 5,376,573 | A | 12/1994 | Richart et al. ............... 437/48 |
| 5,399,516 | A | 3/1995 | Bergendahl et al. ......... 437/43 |
| 5,479,368 | A | 12/1995 | Keshtbod .................. 365/185.01 |
| 5,543,339 | A | 8/1996 | Roth et al. .................... 437/43 |
| 5,576,232 | A | 11/1996 | Hong .......................... 437/43 |
| 5,587,332 | A | 12/1996 | Chang et al. ................. 437/43 |
| 5,616,941 | A | 4/1997 | Roth et al. ................... 257/315 |
| 5,640,031 | A | 6/1997 | Keshtbod .................... 257/315 |
| 5,661,053 | A | 8/1997 | Yuan .......................... 437/43 |
| 5,668,757 | A | 9/1997 | Jeng ........................ 365/185.1 |
| 5,696,019 | A | 12/1997 | Chang ......................... 437/67 |
| 5,712,179 | A | 1/1998 | Yuan .......................... 437/43 |
| 5,736,442 | A | 4/1998 | Mori .......................... 438/257 |
| 5,763,309 | A | 6/1998 | Chang ......................... 438/262 |
| 5,770,501 | A | 6/1998 | Hong .......................... 438/264 |
| 5,776,787 | A | 7/1998 | Keshtbod ..................... 437/43 |
| 5,851,879 | A | 12/1998 | Lin et al. .................... 438/257 |
| 5,856,943 | A | 1/1999 | Jeng ........................ 365/185.14 |
| 5,909,628 | A | 6/1999 | Chatterjee et al. .......... 438/424 |
| 5,912,843 | A | 6/1999 | Jeng ........................ 365/185.14 |
| 5,943,261 | A | 8/1999 | Lee ......................... 365/185.14 |
| 5,953,255 | A | 9/1999 | Lee ......................... 365/185.29 |

(List continued on next page.)

FOREIGN PATENT DOCUMENTS

JP          61-191052      *  8/1986       .................. 438/396

OTHER PUBLICATIONS

S. Aritome et al., "A 0.67mn$^2$ Self–Aligned Shallow Trench Isolation Cell (SA–STI Cell) For 3V –only 256Mbit Nand EEPROMs", (IEDM Tech. Dig. Dec. 11–14, 1994, pp. 61–64), pp. 3.6.1–3.6.4.

(List continued on next page.)

Primary Examiner—Jasmine Clark
(74) Attorney, Agent, or Firm—Michael Shenker; McPherson Kwok Chen & Heid LLP

(57) ABSTRACT

Circuit elements (e.g. transistor gates) formed over a semiconductor substrate are protected by adjacent dummy structures during mechanical or chemical mechanical polishing of an overlying dielectric.

12 Claims, 10 Drawing Sheets

U.S. PATENT DOCUMENTS

| | | | | |
|---|---|---|---|---|
| 5,963,473 | A | 10/1999 | Norman | 365/185.02 |
| 5,965,913 | A | 10/1999 | Yuan et al. | 257/321 |
| 5,991,204 | A | 11/1999 | Chang | 365/185.29 |
| 6,001,687 | A | 12/1999 | Chu et al. | 438/257 |
| 6,001,706 | A | 12/1999 | Tan et al. | 438/424 |
| 6,013,551 | A | 1/2000 | Chen et al. | 438/264 |
| 6,025,229 | A | 2/2000 | Hong | 438/264 |
| 6,027,971 | A | 2/2000 | Cho et al. | 438/257 |
| 6,028,336 | A | 2/2000 | Yuan | 257/315 |
| 6,043,530 | A | 3/2000 | Chang | 257/320 |
| 6,043,536 | A | 3/2000 | Numata et al. | 257/347 |
| 6,054,355 | A | 4/2000 | Inumiya et al. | 438/296 |
| 6,057,572 | A | 5/2000 | Ito et al. | 257/296 |
| 6,057,575 | A | 5/2000 | Jenq | 257/319 |
| 6,066,544 | A | 5/2000 | Pan et al. | 438/424 |
| 6,087,208 | A | 7/2000 | Krivokapic et al. | 438/183 |
| 6,103,592 | A | 8/2000 | Levy et al. | 438/424 |
| 6,108,236 | A | 8/2000 | Barnett | 365/185.09 |
| 6,165,692 | A | 12/2000 | Kanai et al. | 430/311 |
| 6,166,415 | A | 12/2000 | Sakemi et al. | 257/372 |
| 6,169,012 | B1 | 1/2001 | Chen et al. | 438/264 |
| 6,171,910 | B1 | 1/2001 | Hobbs et al. | 438/275 |
| 6,171,971 | B1 | 1/2001 | Natzle | 438/706 |
| 6,171,976 | B1 | 1/2001 | Cheng | 438/760 |
| 6,177,303 | B1 | 1/2001 | Schmitz et al. | 438/194 |
| 6,191,001 | B1 | 2/2001 | Chen et al. | 438/427 |
| 6,191,049 | B1 | 2/2001 | Song | 438/758 |
| 6,191,444 | B1 | 2/2001 | Clampitt et al. | 257/315 |
| 6,198,657 | B1 | 3/2001 | Uekubo et al. | |
| 6,222,775 | B1 | 4/2001 | Cappelletti | |
| 6,228,715 | B1 | 5/2001 | Shimoji | 438/264 |
| 6,261,883 | B1 * | 7/2001 | Koubuchi et al. | 438/197 |
| 6,266,277 | B1 | 7/2001 | Roohparvar | 365/185.18 |
| 6,355,524 | B1 | 3/2002 | Tuan et al. | 438/257 |
| 6,392,928 | B1 | 5/2002 | Roohparvar | 365/185.18 |
| 6,403,417 | B1 | 6/2002 | Chien et al. | 438/241 |
| 6,643,186 | B2 | 11/2003 | Tuan et al. | |

OTHER PUBLICATIONS

William D. Brown et al., "Nonvolatile Semiconductor Memory Technology" "A Comprehensive Guide to Understanding and Using NVSM Devices", (IEEE Press series on microelectronic systems 1998), pp. 21–23.

K. Naruke et al., "A New Flash–Erase EEProm Cell With A Sidewall Select–Gate On Its Source Side", (IEDM Tech. Dig. Dec. 3–6, 1989, pp, 603–606), pp. 25.7.1–25.7.4.

K. Shimizu et al., "A Novel High–Density $5F^2$ NAND STI Cell Technology Suitable for 256Mbit and 1 Gbit Flash Memories", (IEEE Tech. Dig. Dec. 7–10, 1997, pp. 271–274), pp. 11.1.1–11.1.4.

R. Shirota, "A Review of 256Mbit NAND Flash Memories and NAND Flash Future Trend", (Microelectronics Engineering Laboratory), unknown date before Aug. 15, 2000, pp. 22–31.

R. Shirota, "A Review of 256Mbit NAND Flash Memories and NAND Flash Future Trend", Nonvolatile Memory Workshop, Monterey, CA, Feb. 2000, pp. 22–31.

A. T. Wu et al., "A Novel High–Speed, 5–Volt Programming Eprom Structure With Source–Side Injection", (IEDM Tech. Dig., pp. 584–587, 1986), pp. 108–111.

William D. Brown et al., "Nonvolatile Semiconductor Memory Technology" A Comprehensive Guide to Understanding and Using NVSM Devices, IEEE Press 1998, pp. 241–245.

* cited by examiner

DUMMY STRUCTURES THAT PROTECT CIRCUIT ELEMENTS DURING POLISHING

CROSS REFERENCE TO RELATED APPLICATIONS

The present application is a division of U.S. patent application Ser. No. 09/846,123 filed Apr. 30, 2001, now U.S. Pat. No. 6,559,055 B2 incorporated herein by reference, which is a continuation-in-part of U.S. patent application Ser. No. 09/640,139 filed Aug. 15, 2000, now U.S. Pat. No. 6,355,524, incorporated herein by reference.

BACKGROUND OF THE INVENTION

The present invention relates to fabrication of integrated circuits, and more particularly to use of polishing processes, such as chemical mechanical polishing (CMP), in the fabrication of integrated circuits.

CMP is widely used to planarize the top surface of a dielectric layer before the dielectric is patterned or subsequent layers are deposited. Planarization is desirable because it relaxes the depth of focus requirements for photolithographic equipment used to pattern the dielectric layer or the overlying layers. If the top surface of the dielectric is planar, greater variation of the depth of focus can be tolerated. This is especially important if the photolithographic equipment has to create small geometries.

CMP is widely used for planarization because CMP is fast and does not require high temperatures.

SUMMARY

Chemical mechanical polishing of a dielectric layer typically stops on a harder layer underlying the dielectric layer. For example, CMP of silicon dioxide can stop on silicon nitride deposited before the silicon dioxide. See U.S. Pat. No. 5,909,628, issued Jun. 1, 1999, entitled "REDUCING NON-UNIFORMITY IN A REFILL LAYER THICKNESS FOR A SEMICONDUCTOR DEVICE".

Some embodiments of the present invention relate to integrated circuits which have circuit elements formed from different conductive or semiconductor layers. For example, an integrated circuit may have transistor gates formed from different polysilicon layers. A dielectric overlies these polysilicon layers, and is polished by CMP. A harder layer is formed over the polysilicon layers underneath the dielectric layer. CMP stops on the harder layer. For example, the dielectric polished by CMP can be silicon dioxide, and the harder layer can be silicon nitride. The harder layer is patterned to form protective features over one of the polysilicon layers ("first polysilicon layer") but not over the other one of the polysilicon layers ("second polysilicon layer"). Dummy structures are formed from the first polysilicon layer adjacent to the transistor gates formed from the second polysilicon layer. Dummy structures include portions of the first polysilicon layer and portions of the harder layer. The harder layer portions protect the transistor gates formed from the second polysilicon layer from being exposed during the polishing.

In some embodiments, the first and second polysilicon layers also provide capacitor plates in the integrated circuit. In some embodiments, the circuit processes analog signals and, possibly, also digital signals.

The invention is not limited to transistors gates or capacitor plates. The invention is not limited to polysilicon, silicon dioxide, silicon nitride, or any other particular materials. In some embodiments, a method for fabricating an integrated circuit comprises: forming a first layer over a semiconductor substrate, the first layer providing at least a portion of a first circuit element and at least a portion of a dummy element; forming a second layer over the semiconductor substrate, the second layer providing at least a portion of a second circuit element; forming a protective feature from a third layer over the first circuit element and the dummy element but not over the second circuit element; forming a dielectric layer over the first, second and third layers; and polishing the dielectric layer by a polishing process that stops on the third layer, such that the protective feature over the dummy element protects the second element during the polishing process.

Other features and advantages of the invention are described below.

DESCRIPTION OF PREFERRED EMBODIMENTS

Figure 1:
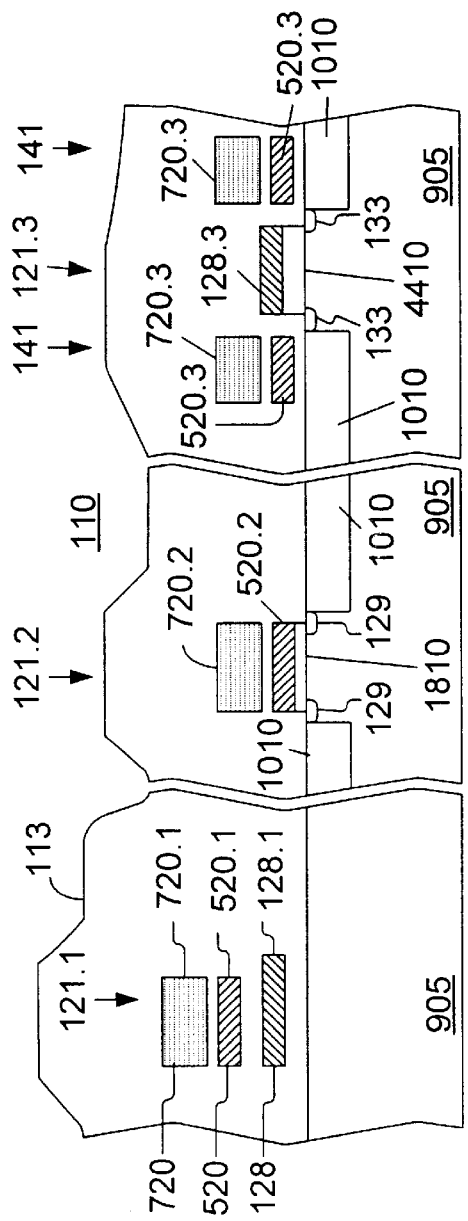
FIGS. 1–11 are cross-section illustrations of semiconductor structures in the process of fabrication.

FIG. 1 illustrates a cross-section of a semiconductor structure 110. The structure includes layers 128, 520 formed over a semiconductor substrate 905. Substrate 905 is made of monocrystalline silicon or some other semiconductor material. Layers 128, 520 are made of polysilicon, metal, metal silicide, polycide, or other materials. In some embodiments, layers 128, 520 are conductive. In other embodiments, a layer 128 or 520 includes a conductive portion as well as a non-conductive portion. For example, a layer 128 or 520 can be a polysilicon layer a portion of which is made conductive by doping. Layers 128, 520 can be made of different materials. For example, one of these layers can be made of polysilicon and the other layer can be made of metal. Each of layers 128, 520 can be a combination of different layers.

Protective layer 720 is formed over the layer 520 to protect the layer 520 during chemical mechanical polishing of a dielectric layer 113. Dielectric 113 is formed over the layers 128, 520, 720. In some embodiments, dielectric 113 is used to insulate the substrate 905 and the layers 128, 520 from other layers (not shown) formed over the layer 113. In other embodiments, layer 113 is a passivation layer formed as the last layer before dicing or packaging of a wafer in which the structure 110 is formed.

In some embodiments, layer 720 is silicon nitride, and dielectric 113 is doped or undoped silicon dioxide, for example, borophosphosilicate glass. Other materials can also be used.

Circuit structure 121.1 includes a circuit element 128.1 formed from layer 128 and a circuit element 520.1 formed from layer 520. In one embodiment, elements 128.1 and 520.1 are plates of a capacitor. In another embodiment, element 128.1 is a gate of a thin film transistor, and element 520.1 is a source, drain, and/or channel region of the transistor. Other embodiments include other circuit elements, known or to be invented. Elements 128.1, 520.1 can belong to different devices. For example, element 128.1 can be a transistor gate, and element 520.1 can be a resistor, a capacitor plate, or an interconnect.

Protective feature 720.1 is formed from layer 720 over circuit element 520.1. Protective feature 720.1 will protect the elements 128.1, 520.1 during chemical mechanical polishing (CMP) of dielectric 113.

Layer 520 provides a circuit element 520.2. In the embodiment of FIG. 1, element 520.2 is a gate a transistor 121.2. Transistor 121.2 has source/drain regions 129 in substrate 905. Transistor 121.2 has gate insulation 1810 between substrate 905 and gate 520.2. The invention is not limited to such transistors however. Element 520.2 can be a capacitor plate, a resistor, an interconnect, or any other suitable element.

Protective feature 720.2 is formed from layer 720 over element 520.2 to protect the element 520.2 during chemical mechanical polishing of dielectric 113.

Layer 128 provides a circuit element 128.3. In FIG. 1, element 128.3 is a gate of transistor 121.3. Transistor 121.3 includes source/drain regions 133 formed in substrate 905. Gate 128.3 is separated from the substrate by gate insulation 4410. The invention is not limited to such transistors. Element 128.3 can be a capacitor plate, a resistor, an interconnect, or any other suitable element.

At least a portion of element 128.3 is not overlaid by layer 720.

Dummy structures 141 are formed adjacent to the element 128.3 to protect this circuit element during the chemical mechanical polishing of dielectric 113. Each of the dummy structures includes a portion 520.3 of layer 520. In each dummy structure, a feature 720.3 made from layer 720 overlies the respective portion 520.3. Features 520.3, 720.3 do not provide any circuit elements and do not provide any electrical functionality. Features 520.3 may be connected to a constant potential or left floating.

In some embodiments, only one dummy structure is provided. Any number of dummy structures can be provided adjacent to the element 128.3. In some embodiments, a single dummy structure is provided which surrounds the element 128.3 laterally on all sides.

FIG. 1 illustrates field isolation regions 1010. In some embodiments, these regions are formed by shallow trench isolation techniques described in the aforementioned U.S. patent application Ser. No. 09/640,139. Alternatively, these regions can be formed by LOCOS or some other technique, known or to be invented. Dummy structures 141 are shown positioned over the field isolation regions, but this is not necessary. The field isolation regions may be absent.

Figure 2:
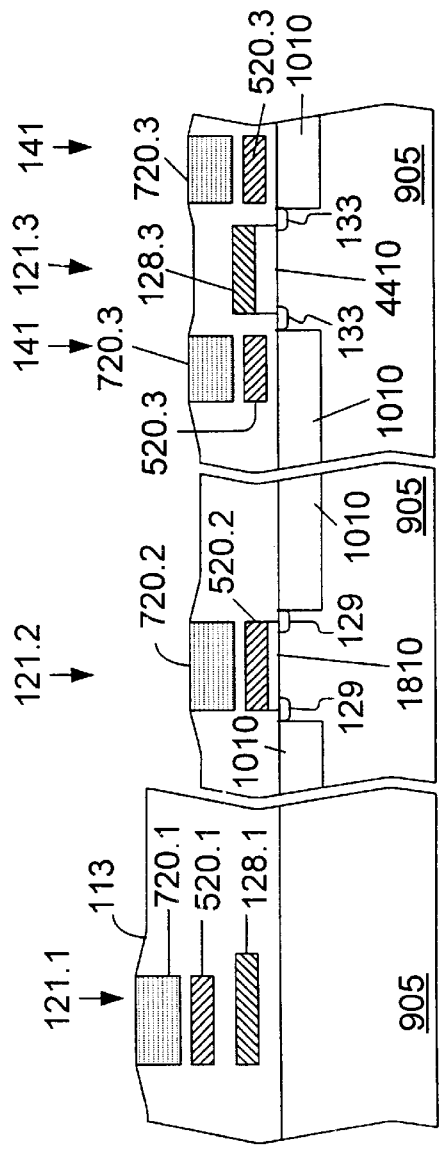

The top surface of dielectric 113 is not planar due to non-planarity of the underlying topology. To planarize the structure, the dielectric 113 is subjected to chemical mechanical polishing which stops on layer 720. The resulting structure is shown in FIG. 2. In some embodiments, the top surface of the structure is completely planar. In other embodiments, some non-planarity may remain. One reason for the non-planarity may be non-planarity of layer 720. In FIG. 2, the top surface of layer 720 over the elements 520.2, 520.3 is lower than the top surface of layer 720 over the element 520.1. Further, the top surface of polished dielectric 113 can be lower in those parts of the structure in which the layer 720 is not present, for example, over the element 128.3. An additional reason for less than perfect planarity can be lower density of features formed from layer 720 in some portions of the integrated circuit than in other portions. See U.S. Pat. No. 5,909,628 issued Jun. 1, 1999, entitled "REDUCING NON-UNIFORMITY IN A REFILL LAYER THICKNESS FOR A SEMICONDUCTOR DEVICE", incorporated herein by reference. However, the top surface of structure 110 is made more planar by the chemical mechanical polishing and is substantially planar.

In some embodiments, the height difference between the high point of layers 720 and the low point of dielectric 113 is less than 15 nm. As is well known, the degree of non-planarity depends on the thickness of dielectric 113, the polishing time, and the CMP parameters (such as pressure). The degree of non-planarity also depends on the particular CMP technology, for example, whether the CMP uses a slurry or is a slurry-less fixed-abrasive process. The invention is not limited to any particular CMP process or the degree of non-planarity.

In some embodiments, not all of layer 720 is exposed by polishing. For example, if the top surface of feature 720.1 is higher than the top surface of feature 720.2, the polishing process may expose the feature 720.1 but not the feature 720.2.

Dummy structures 141 prevent the element 128.3 from being exposed. In some embodiments, the distance between adjacent structures 141 on the opposite sides of element 128.3 is about 5 $\mu$m; layer 720 is silicon nitride about 160 nm thick; dielectric 113 is silicon dioxide, possibly BPSG; and the top surface of dummy features 720.3 is about 0.21 $\mu$m above the top surface of feature 128.3. In other embodiments, the distance between adjacent dummy structures 141 on the opposite sides of element 128.3 is up to 10 $\mu$m. The maximum allowable distance may depend on the materials used, the layer thicknesses, and the quality of the CMP process.

A dummy structure or structures can be provided on only one side of structure 121.3.

If dielectric 113 is not sufficiently thick over the element 128.3 to provide desired insulation, another dielectric layer (not shown) can be deposited over the structure. This layer will have a substantially planar top surface because it will be deposited over a structure planarized by the CMP of layer 113.

In some embodiments, the CMP of dielectric 113 at least partially exposes the element 128.3. Dummy structures 141 reduce the amount of polishing to which the element 128.3 is exposed during the CMP process. An additional dielectric layer (not shown) can then be deposited as described above to insulate the element 128.3.

Gate insulation 1810 and gate insulation 4410 do not have to be formed from the same insulating layer or layers. Different insulating layers can be used, especially if it is desirable to provide different gate insulation thicknesses for the respective transistors 121.2, 121.3. A thinner gate insulation is desirable for high speed. A thicker gate insulation may be needed for transistors exposed to high voltages. In some embodiments, such transistors are used to provide I/O interface to off chip circuitry.

An exemplary fabrication sequence is as follows. Substrate 905 is processed as needed (to form CMOS wells, for example; the invention is not limited to CMOS however). Then layer 4410, and possibly layer 1810 and other layers, are formed. Layer 128 is deposited and patterned. Other layers are formed if needed. Layer 520 is deposited and patterned. Then other layers are formed if needed. Layer 720 is deposited and patterned. Then dielectric 113 is deposited and polished by CMP. Doping steps are performed at suitable stages of fabrication.

Layers 128, 520, can be deposited using chemical vapor deposition (CVD), sputtering, or other techniques, known or to be invented.

The invention is not limited to any particular fabrication sequence. For example, layers 720, 520 may be patterned at the same time, using a single mask. Also, layer 1810 can be formed after layer 128.

Figure 3:
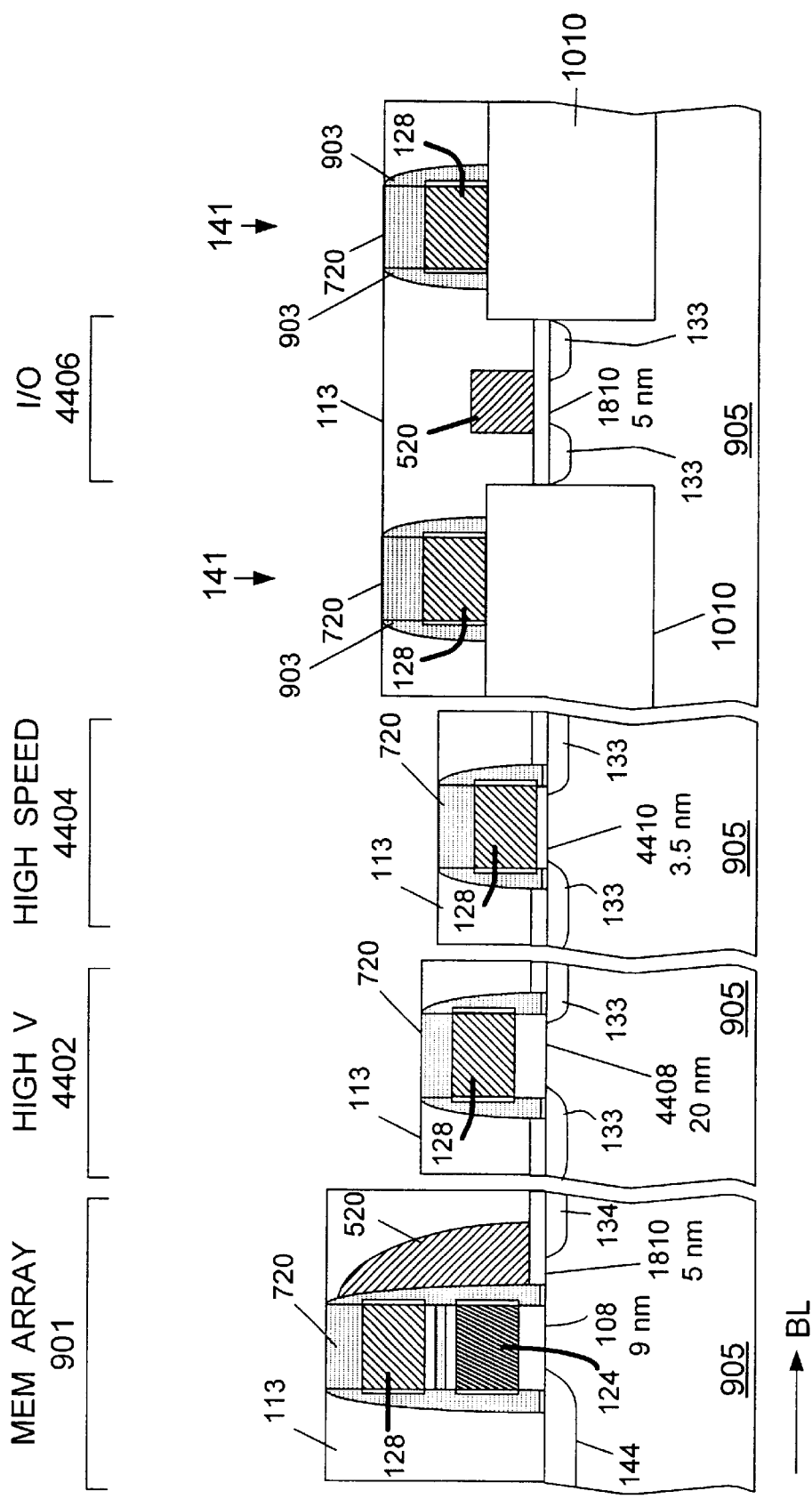

In FIG. 3, dummy structures 141 are made using the layer 128. The integrated circuit of FIG. 3 includes a flash memory array 901 of the kind described in aforementioned U.S. patent application Ser. No. 09/640,139. Silicon layer 124 provides floating gates for the memory cells. Polysilicon layer 128 provides control gates. Polysilicon layer 520 provides select gates. Insulation 108 ("tunnel oxide") is made of silicon dioxide and is sufficiently thick to provide suitable data retention. In some embodiments, the thickness of oxide 108 is 9 nm. The particular materials and their thicknesses are mentioned for illustration only and do not limit the invention.

A memory cell can be erased by Fowler-Nordheim tunneling of electrons from its floating gate 124 through silicon dioxide 108 to source line 144 or a region of substrate 905. The cell can be programmed by source-side hot electron injection.

Select transistor gate oxide 1810 is 5 nm thick in some embodiments.

Bit line regions 134 of the memory cells are connected to overlying bit lines (not shown) which extend in the "BL" (bit line) direction of the memory array. Source line regions 144 extend in the word line direction, which is perpendicular to the bit line direction.

The integrated circuit includes active areas 4402, 4404, 4406 in which transistors are formed. High voltage active area 4402 is utilized for transistors exposed to high voltages used to erase and program the memory cells of array 901. The transistor gates in this area are made of layer 128. Gate insulation 4408 in this area is silicon dioxide about 20 nm thick.

High speed area 4404 includes transistors with thinner gate oxide 4410, for low voltage operation. Oxide 4410 is 3.5 nm thick in some embodiments. The transistor gates are made from layer 128.

I/O active area 4406 is for transistors providing interface to off chip circuitry. The off chip circuitry may operate at higher power supply voltages than the transistors in area 4404. The transistors in area 4406 have a thicker gate oxide to withstand such voltages. In some embodiments, the gate insulation used for these transistors is made of the same layer 1810 as the gate insulation for the select transistors of the memory array.

A reference numeral 133 indicates the source and drain regions of transistors in areas 4402, 4404, 4406. Field insulation 1010 is formed around the transistors in areas 4406 and, possibly other transistors.

The memory is manufactured as described in the aforementioned U.S. patent application Ser. No. 09/640,139. Pertinent fabrication steps are briefly described immediately below.

Figure 4:
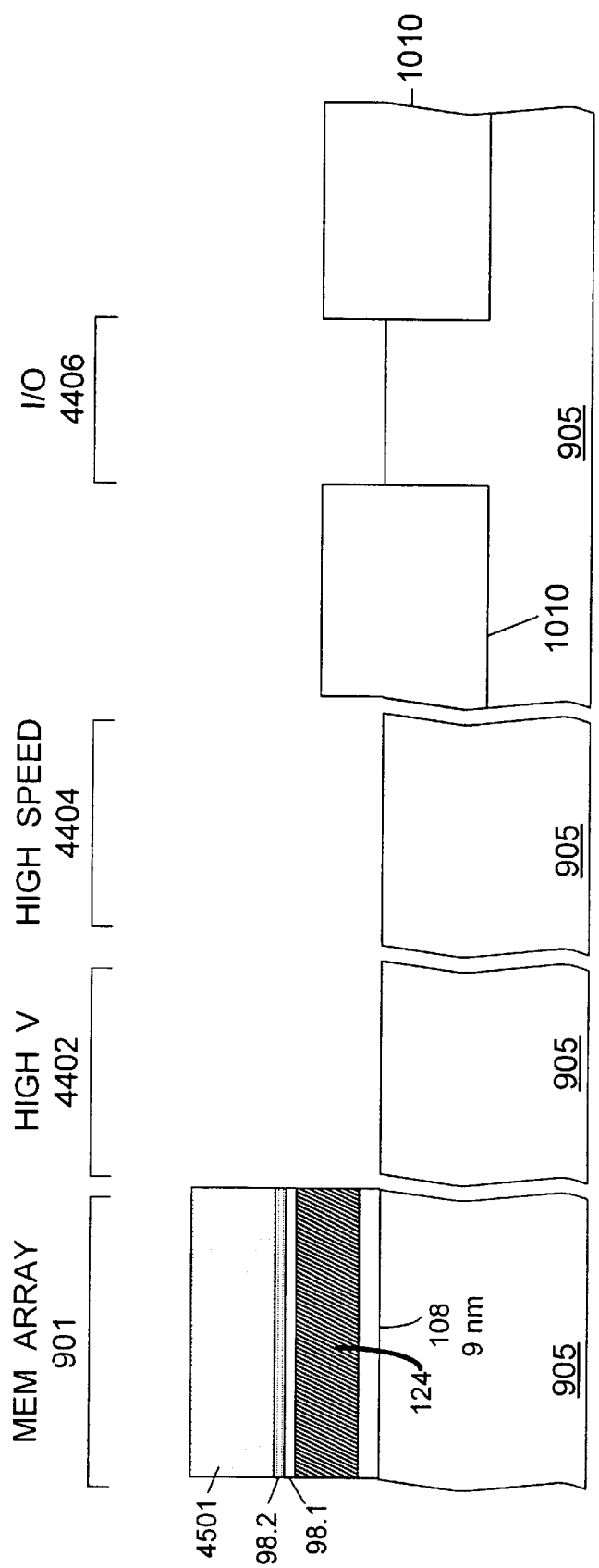

Tunnel oxide 108 is grown on substrate 905 by thermal oxidation to the desired thickness (9 nm). See FIG. 4. Then polysilicon layer 124 is deposited. Then silicon dioxide 98.1 and silicon nitride 98.2 are deposited, in that order. Then, a photoresist mask 4501 is deposited and photolithographically patterned to cover the memory array 901. Layers 98.2, 98.1, 124, 108 are etched off in areas 4402, 4404, 4406. Substrate 905 becomes exposed in these areas.

Before the deposition of silicon dioxide 98.1, the layer 124 and the substrate 905 were patterned to form isolation trenches for shallow trench isolation. The trenches were filled with silicon dioxide 1010.

Figure 5:
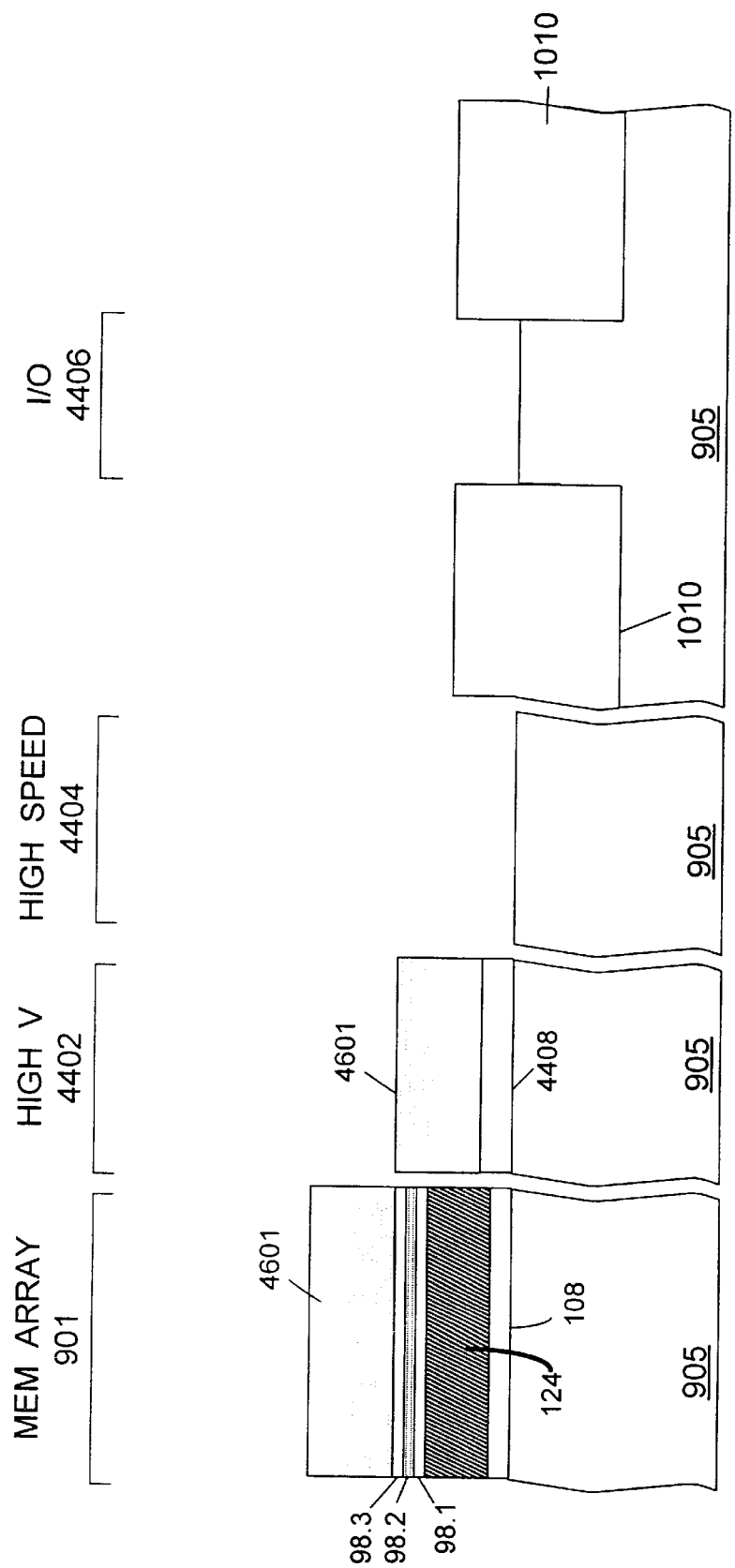

After the etch of oxide 108, resist 4501 is removed. Oxide 4408 (FIG. 5) is grown thermally on substrate 905. In some embodiments, oxide 4408 is 19 nm thick. A thin layer 98.3 of silicon dioxide forms on silicon nitride 98.2 during this step.

A photoresist mask 4601 is formed photolithographically to cover the memory array 901 and the high voltage area 4402. Silicon dioxide 4408 is etched off the substrate in areas 4404, 4406.

Figure 6:
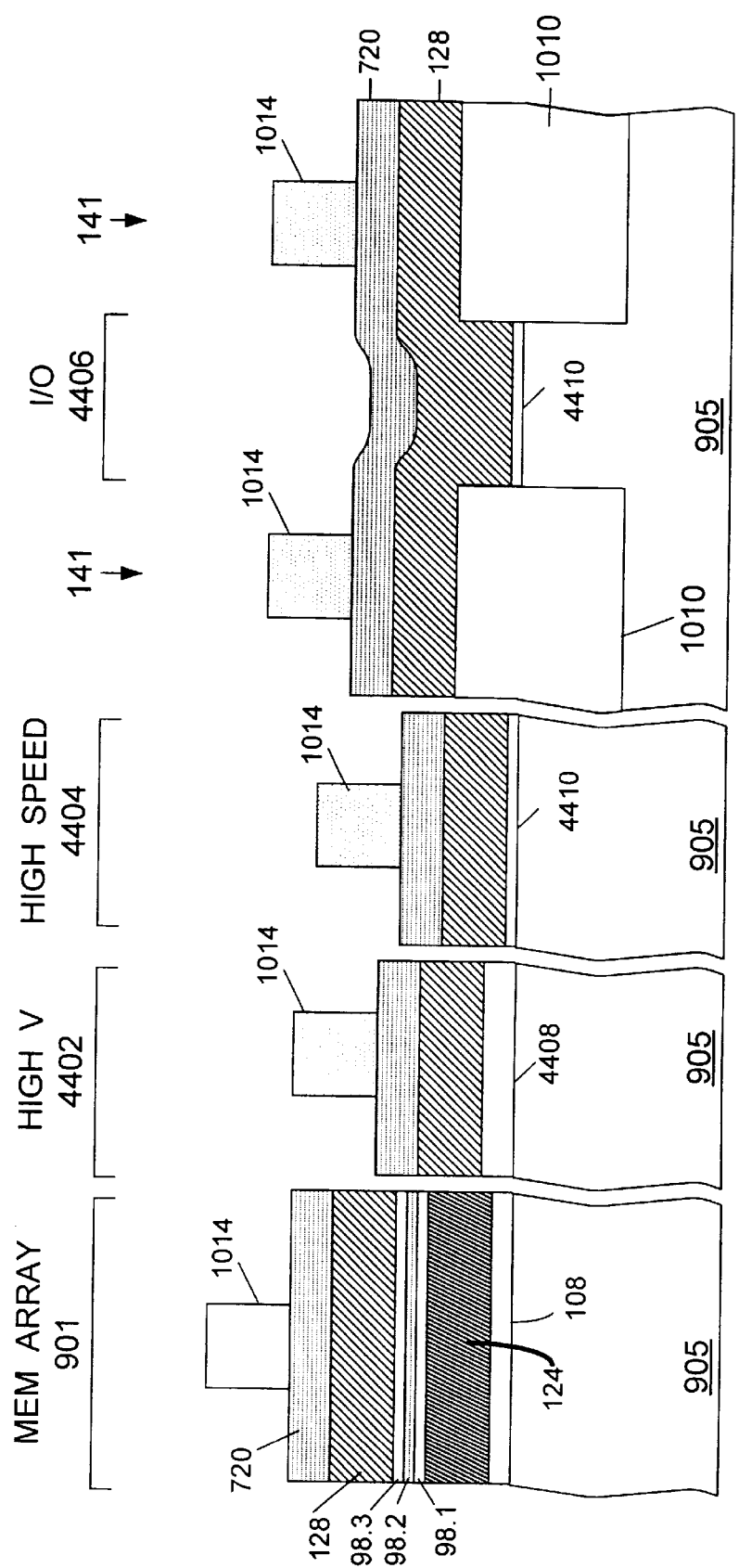

Then resist 4601 is removed. The wafer is oxidized to grow silicon dioxide 4410 (FIG. 6) on substrate 905 in areas 4404, 4406. In some embodiments, the thickness of oxide 4410 is 3.5 nm. The thickness of oxide 4408 in area 4402 slightly increases during this step.

Figure 7:
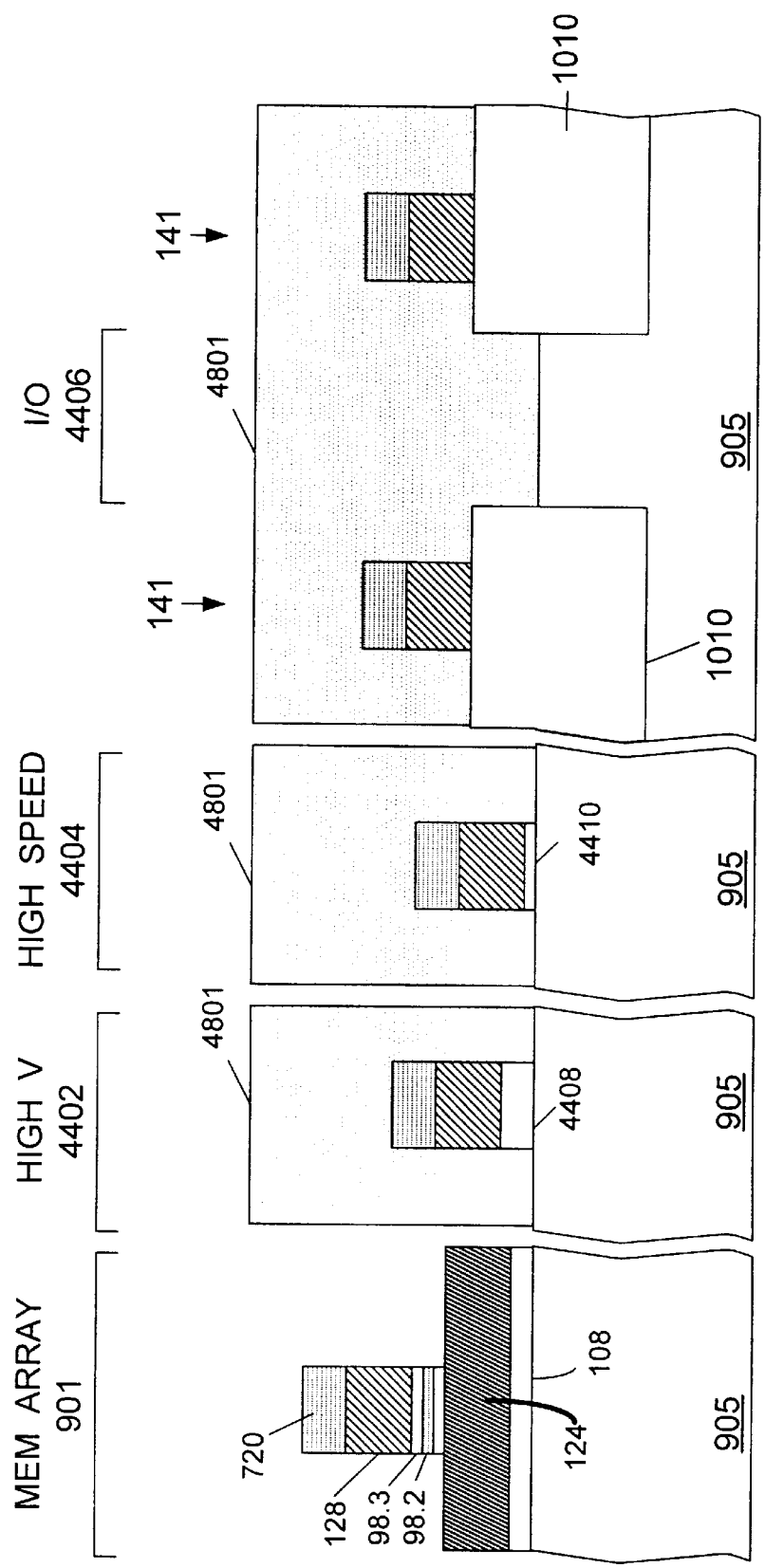

Then polysilicon layer 128 and silicon nitride 720 are deposited over the wafer. A photoresist mask 1014 is formed to define (i) the floating gates and the control gates of the memory array, (ii) the transistor gates in areas 4402, 4404, and (iii) dummy structures 141 in area 4406. See FIG. 7. The layers 720, 128, 98.3, 98.2, 98.1, 4408, 4410 are etched off the regions exposed by the mask. The etch stops at polysilicon 124 in the memory array area and at substrate 905 in the remaining areas.

Then the resist 1014 is removed. Polysilicon 128 and silicon nitride 720 protect thin gate oxide 4410 in high speed area 4404 during a post-resist cleaning operation.

Figure 8:
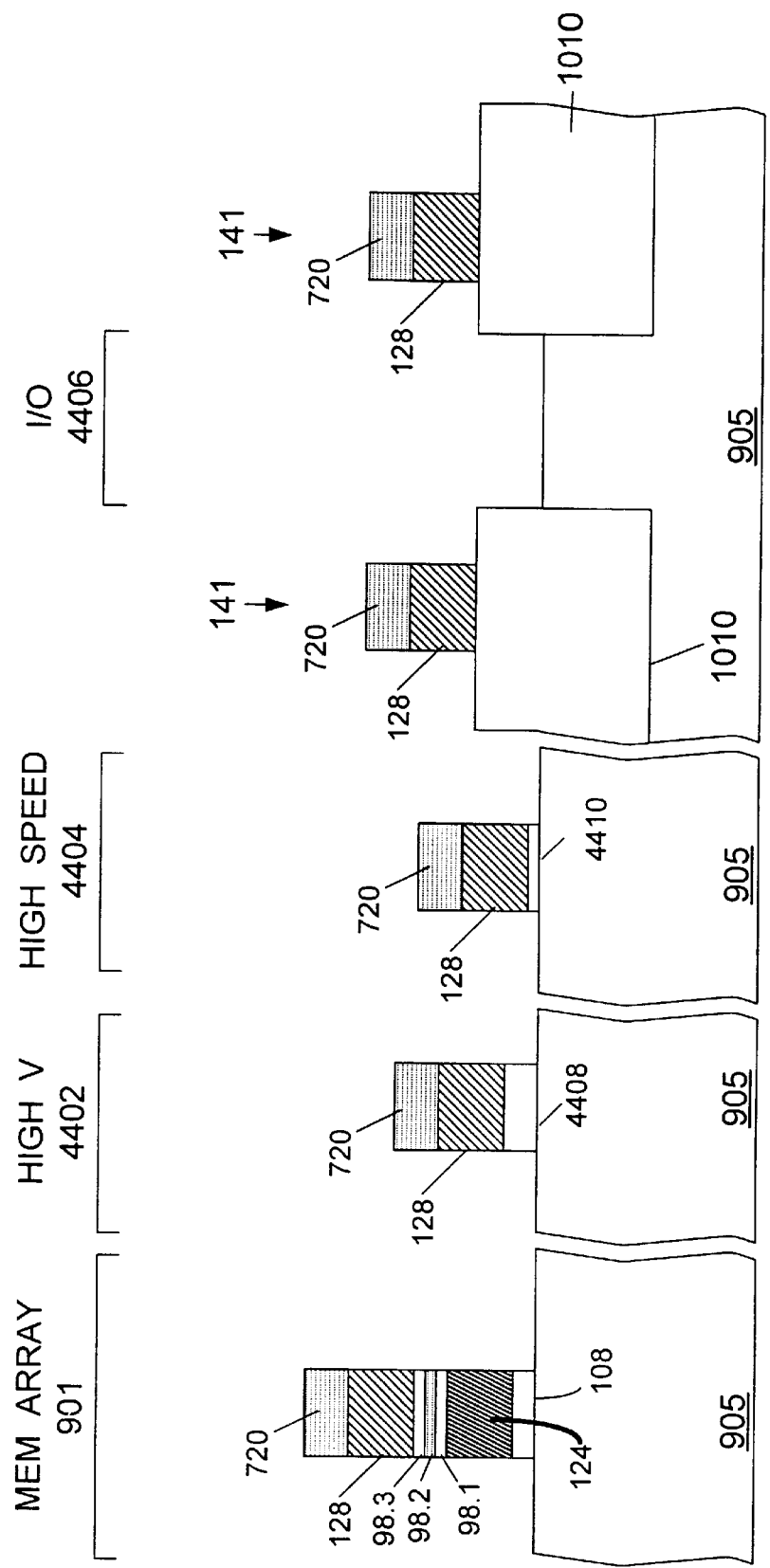

Another photoresist mask 4801 (FIG. 7) is formed to cover all of the areas 4402, 4404, 4406 except, possibly, some regions covered by silicon nitride 720. Polysilicon 124 and silicon dioxide 108 are etched off the wafer except in the regions protected by resist 4801 and silicon nitride 720. Photoresist 4801 is removed. The resulting structure is shown in FIG. 8.

Figure 9:
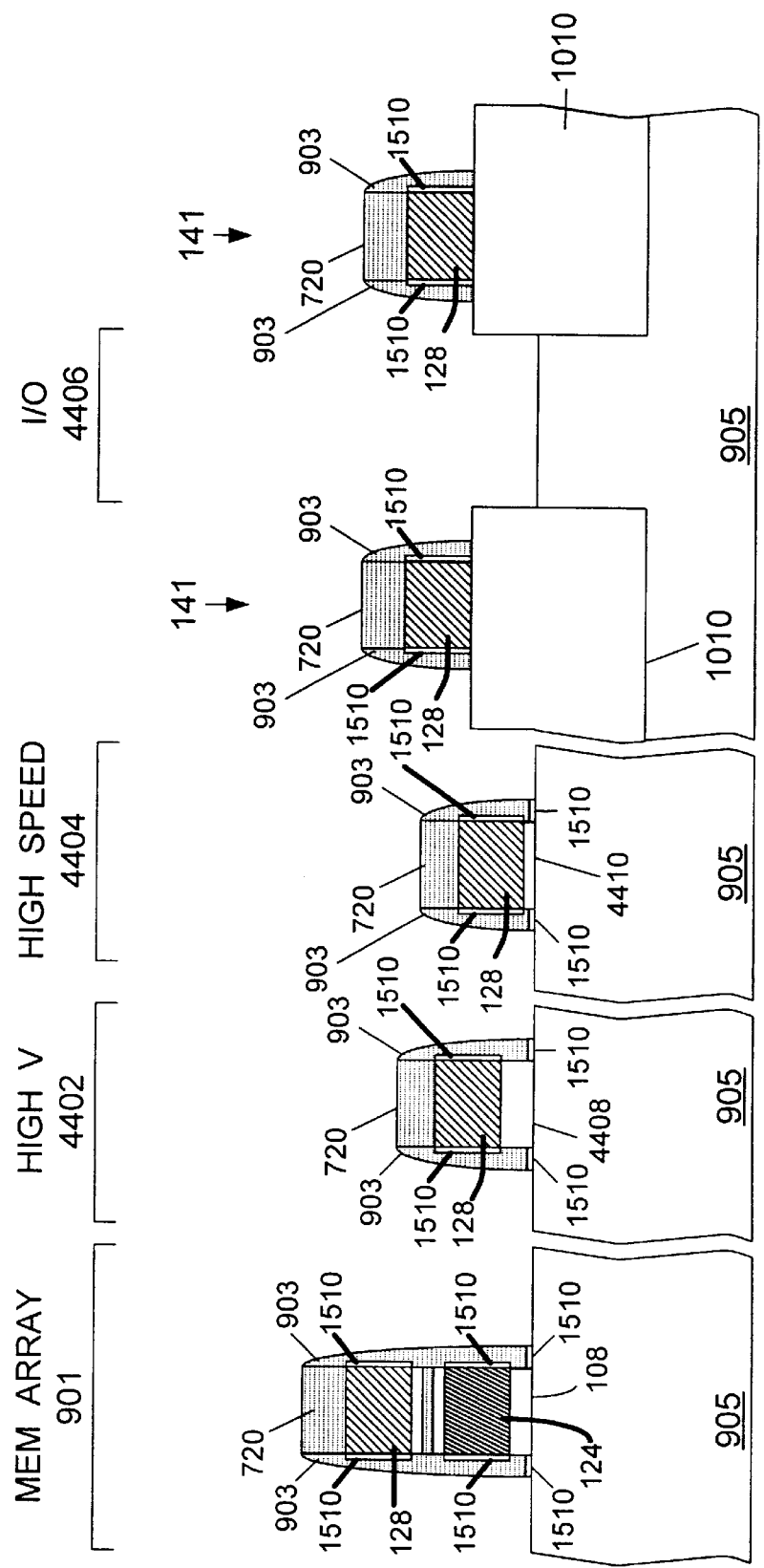

The structure is oxidize to grow a thin silicon dioxide layer 1510 (FIG. 9) on the exposed sidewalls of layers 124, 128, and on substrate 905. Then a thin conformal layer 903 of silicon nitride is deposited and etched anisotropically to form spacers over the transistor gate structures and the dummy structures. Silicon dioxide 1510 exposed during the etch of nitride 903 may be removed during this etch.

Silicon dioxide 1810 is grown by thermal oxidation on the exposed surfaces of substrate 905 to a desired thickness, 5 nm in some embodiments.

Figure 10:
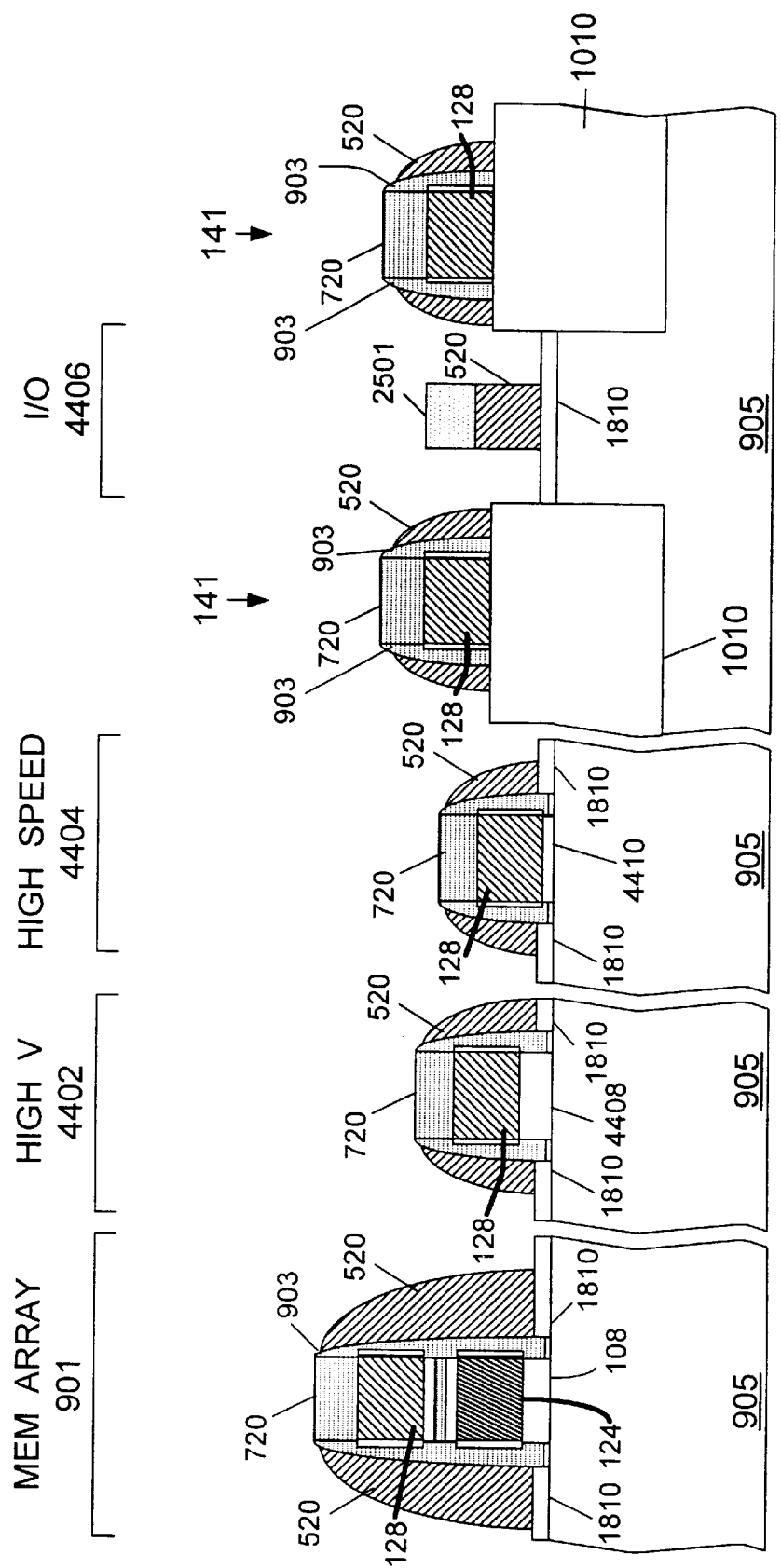

Polysilicon 520 (FIG. 10) is deposited as a conformal layer over the structure. A photoresist mask 2501 is formed to define the transistor gates in the I/O area 4406. Layer 520 is etched anisotropically to form spacers on the sidewalls of the transistor gate structures and the dummy structures.

Figure 11:
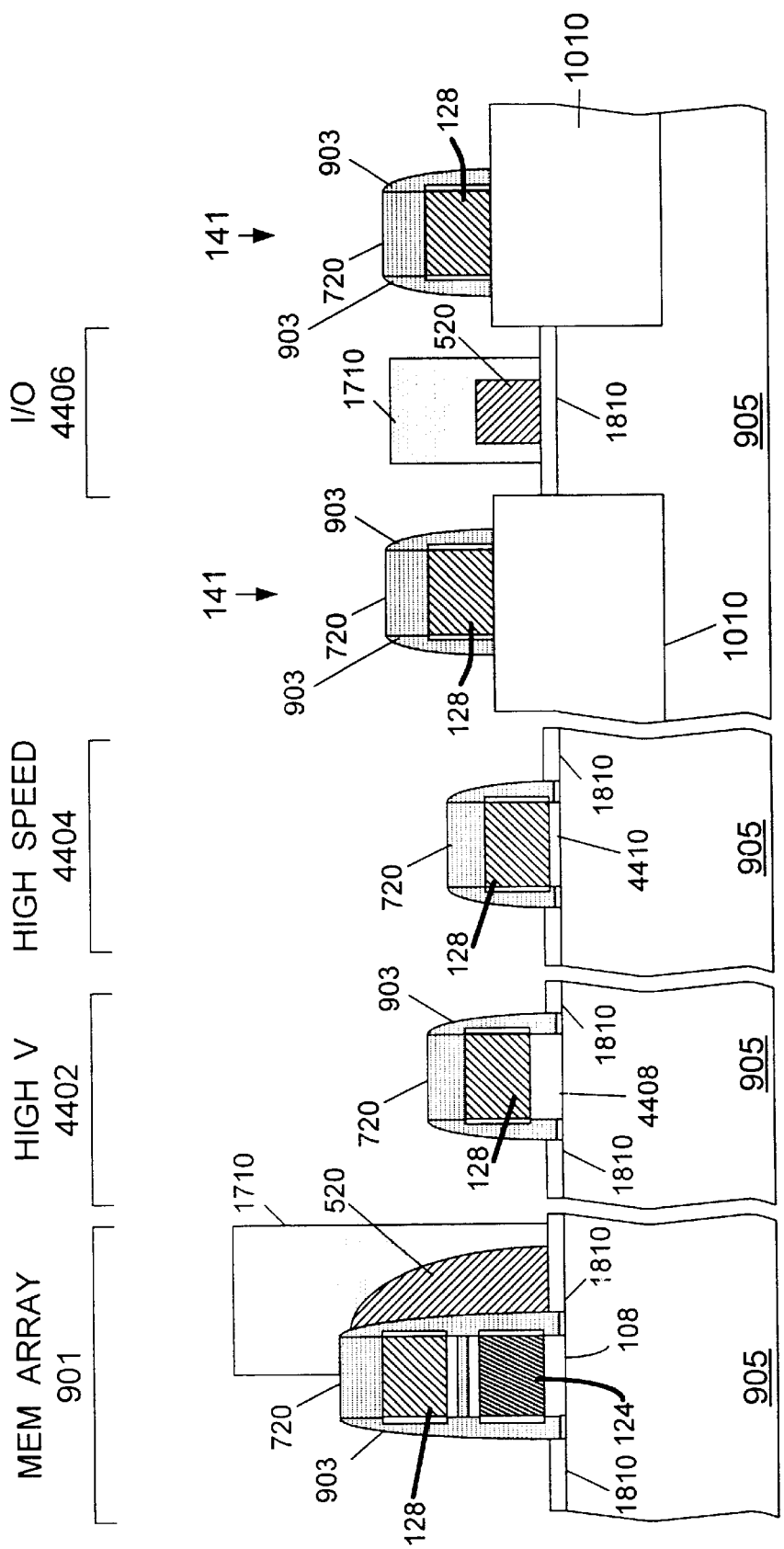

Resist 2501 is removed. A photoresist layer 1710 (FIG. 11) is formed over the gates of the I/O transistors and the select gates 520 of the memory array. Polysilicon 520 is etched off the remaining areas.

Suitable doping steps to form the transistor source and drain regions, the bit line and source line regions, and possibly other doped features, can be performed at appropriate stages of fabrication. See the aforementioned U.S. patent application Ser. No. 09/640,139.

The invention is not limited to any particular materials, thicknesses, circuits, or fabrication steps. The invention is applicable to purely mechanical polishing. Other embodiments and variations are within the scope of the invention, as defined by the appended claims.

What is claimed is:

1. An integrated circuit comprising:

a semiconductor substrate;

a first circuit element formed over the semiconductor substrate;

a second circuit element formed over the semiconductor substrate;

a dummy element adjacent to the second circuit element;

a first feature formed over the first circuit element;

a second feature formed over the dummy element, wherein the first and second features are formed from a first material;

a dielectric having a substantially planar top surface, a material of the dielectric being different from the first material, the dielectric overlying the second circuit element and filling a region between the second circuit element and the dummy element, wherein the top surface of the dielectric is substantially coplanar with the top surfaces of the first and second features;

wherein the first material is not present between the top surface of the second circuit element and the top surface of the dielectric.

2. The integrated circuit of claim 1 wherein the first and second circuit elements are formed from different materials.

3. The integrated circuit of claim 1 wherein the first and second circuit elements are formed from doped polysilicon.

4. The integrated circuit of claim 3 wherein the polysilicon of the first circuit element is doped differently from the polysilicon of the second circuit element.

5. The integrated circuit of claim 1 wherein the first and second features are formed from silicon nitride, and the dielectric is silicon dioxide.

6. The integrated circuit of claim 1 further comprising a third circuit element overlying or underlying the first circuit element and underlying the first feature, the third circuit element being formed from the same material as the second circuit element.

7. The integrated circuit of claim 1 wherein each of the first and second circuit elements comprises a transistor gate.

8. The integrated circuit of claim 7 wherein the first circuit element overlies a first transistor gate insulation and the second circuit element overlies a second transistor gate insulation different in thickness from the first transistor gate insulation.

9. The integrated circuit of claim 1 wherein each of the first and second circuit elements is conductive.

10. The integrated circuit of claim 9 wherein the first and second features are dielectric features.

11. The integrated circuit of claim 9 wherein the dummy element is formed from the same material as the first circuit element.

12. The integrated circuit of claim 2 wherein the dummy element is formed from the same material as the first circuit element.

\* \* \* \* \*